United States Patent [19]

Otto et al.

[11] Patent Number: 4,772,864
[45] Date of Patent: Sep. 20, 1988

[54] MULTILAYER CIRCUIT PROTOTYPING BOARD

[75] Inventors: James C. Otto, Indian Harbour Beach; Herman A. Jones, Melbourne, both of Fla.

[73] Assignee: Harris Corporation, Melbourne, Fla.

[21] Appl. No.: 12,415

[22] Filed: Feb. 9, 1987

[51] Int. Cl.[4] .............................................. H01P 3/08
[52] U.S. Cl. .................................... 333/238; 361/400
[58] Field of Search ............... 333/236, 238, 243, 245, 333/246; 361/399, 400, 403, 409; 174/117 F, 117 FF

[56] References Cited

U.S. PATENT DOCUMENTS

| | | | |
|---|---|---|---|
| 2,019,625 | 11/1935 | O'Brien . | |
| 3,038,105 | 6/1962 | Brownfield . | |
| 3,076,862 | 2/1963 | Luedicke et al. | 174/68.5 |
| 3,191,100 | 6/1965 | Sorvillo . | |
| 3,470,612 | 10/1969 | Helms | 29/593 |
| 4,011,575 | 3/1977 | Groves | 357/17 |
| 4,524,240 | 6/1985 | Stock et al. | 174/68.5 |
| 4,600,970 | 7/1986 | Bauer | 361/403 |
| 4,641,140 | 2/1987 | Heckaman et al. | 333/236 X |
| 4,688,150 | 8/1987 | Peterson | 361/400 X |

Primary Examiner—Paul Gensler
Attorney, Agent, or Firm—John L. DeAngelis, Jr.

[57] ABSTRACT

A multilayer circuit prototyping board for prototyping circuits in a three-layer transmission line structure. The multilayer circuit prototyping board includes grooves and mesas on one side thereof, with wires to be run in the grooves for interconnecting electronic components. The electronic components are mounted on the bottom surface of the prototyping boards with leads protruding through holes in a bottom ground plane into the grooved portions. Wires or solder bridges are located within the grooves for interconnecting the leads of the various electronic components. A removable top ground plane is then placed atop the board base for completing the three-layer structure.

2 Claims, 4 Drawing Sheets

MULTILAYER CIRCUIT PROTOTYPING BOARD

FIELD OF THE INVENTION

This invention relates to a multilayer printed circuit board for constructing prototypes of electronic circuits especially circuits that operate at high frequencies.

BACKGROUND OF THE INVENTION

In the development of electronic systems that include integrated circuits and other components, various types of prototyping boards have been used. These boards include perforated bread boards without conductors, selectively perforated multilayer printed boards, and customized lay-out boards. To accommodate various electronic component packages, a prototype board contains a pattern of perforations that accept component pins for mechanical and electrical interconnection. It is desirable to have an array of such perforations so that the prototyping board can accept a wide variety of electronic component lead spacing.

In the prototyping of high-speed circuits, it is desirable to prototype the circuit on microstrip or stripline. These transmission line media are very popular for short distance, low power applications, including RF microwave circuits and high speed digital circuits. Stripline consists of a printed conductor between two ground planes, typically formed from copper-clad fiberglass sheets. Electrically, stripline has properties similar to coaxial cable transmission lines. Microstrip, a popular transmission line due to ease of fabrication and circuit assembly, uses dielectric substrates with a metal deposited on or etched way to form the circuit line conductors. Microstrip has a single ground plane with a dielectric layer sandwiched between the circuit conductors and the ground plane. Because the circuit conductors are exposed, microstrip is easily used for prototyping high-speed circuits. Although stripline provides inherently better crosstalk performance because the field within the stripline conductor is totally contained between the two ground planes, it has not heretofore been possible to prototype circuits using stripline. This is obvious from the inherent stripline design, wherein it is impossible to access the inner circuit conductors once the stripline board has been fabricated.

In the typical prototyping operation a stripline board is laid out, given due consideration to signal path lengths and interaction between neighboring components. The electronic components are mounted on the prototype stripline board and the performance of the system is observed. If the performance is not adequate, another stripline prototype board is constructed, using the information gained from the unsuccessful lay-out. The components are then attached to the second stripline board and the system is again tested. It is obvious that this iterative approach to devising a working stripline layout suitable for board and circuit production is an expensive and time-consuming process. Further, once a suitable prototype board has been produced, unless the production board is an exact duplicate thereof, the final production circuit may not perform identically to the prototype layout.

In lieu of having another prototyping stripline board constructed, it is also well-known to change the stripline board by simply cutting the ground planes, dielectric layers, and circuit conductors to change the circuit interconnections and component locations. It is also possible to connect components by simply running semi-rigid coaxial cable outside the stripline ground planes. While these techniques allow the stripline board to be changed easily, such a modified stripline board does not have the same crosstalk and signal-to-noise ratio performance as does a stripline board having complete ground planes with all circuit conductors contained therebetween.

It would thus be desirable to provide a three-layer (or stripline-like) prototyping board on which electronic components could be easily mounted and relocated as desired. Such a board would reduce the costly and time-consuming operation of fabricating a new prototyping three-layer board for every circuit change. Such a prototyping board should also desirably facilitate the transfer of the prototyping layout to a production lay-out.

In U.S. Pat. No. 4,695,810 issued Sept. 22, 1987 entitled, "Waffleline-Configured Microwave Transmission Link", and assigned to the assignee of the present application, there is described a miniaturized transmission link for microwave and high-speed circuit applications. The invention provides a scheme for intercoupling high-frequency miniaturized integrated circuit components that provides an extremely compact universal interconnection architecture and provides a constant transmission line impedance along the link, irrespective of the placement of the components within the architectural structure. The invention comprises a thin conductive plate in one surface of which rectilinear grooves or channels are formed. The grooves are formed as a matrix grid work of mutually orthogonal channels, creating a "waffle-iron" like pattern in one surface of the conductive plates. The spacing between channels corresponds to the width of a channel which, in turn, may be sized to substantially match the outer diameter of insulation jacketed wire that is placed in the channels. The depth of a channel or groove is slightly larger than the outer diameter of the wire to accommodate wire crossovers at intersections of the channels. The top surface of the "waffle-plate" is provided with a conductive foil or plate to complete the shielding for the wires.

The conductive (e.g., aluminum) plate is initially etched or machined (e.g., through the application of parallel-spaced apart saw cuts) so that the entire surface of one side of the plate has a waffle-iron configuration. Then, where miniature circuit components are to be provided, selected portions of the waffle-iron structure are further removed to leave pockets for receiving the components. The pockets may be sized to accommodate high-density leadless chip carriers whose input-/output port connections are substantially aligned with the channels of the waffle-iron structure, thereby greatly facilitating their interconnection through the channels of the waffle-iron structure. This invention also provides a feed-through connection so that components can be mounted on the bottom surface of the waffle-iron sheet area. For example, a connector can be mounted on the bottom surface of the sheet and a signal conductor having an inner conductor surrounded by an outer dielectric jacket can be routed through a hole in the waffle-iron sheet. A circular aperture is then provided in the waffle-line plate in a direction orthogonal to the channels. The insulated signal conductor is routed through the aperture for connection to a signal line routed within the channels or grooves.

While the waffleline invention provides an improved high-speed transmission line connection technique, it is not suitable for prototyping of experimental high-speed circuits. Components must be mounted by either removing a portion of the waffle-iron structure to create a hole suitable for receiving the component, or apertures must be drilled in the waffleline structure at locations where components are to be mounted. Thus the waffleine invention does not provide the flexibility necessary for quickly and efficiently breadboarding and later changing an experimental circuit.

SUMMARY OF THE INVENTION

The present invention offers a new and advantageous apparatus for quickly and efficiently prototyping electronic circuits on a multilayer board. If during the design process it is necessary to relocate or change components, this can be quickly accomplished with the present invention. The unwanted components are simply unsoldered and removed from the holes of the multilayer circuit prototyping board and new components inserted as required. This eliminates the costly and time consuming prior art process of designing and building a new three-layer board for the new circuit configuration.

The present invention is essentially a three-layer transmission line prototyping circuit board for interconnecting electronic components. The board includes a base member having a metal ground plane and a plurality of mesa or land portions defined by grooves within the base. There is also a hole running from the top of each land or mesa portion through to the ground plane base member. These land holes are plated-through to effectively connect the top conductive surface of each land portion to the bottom ground plane of the base member. The base member also includes a plurality of holes that run from the bottom ground plane of the board to the grooves. The holes within each groove are surrounded by a small dielectric iris so that contact is not made with the bottom ground plane. Each hole within a groove is also surrounded by a conductive pad at groove level. This conductive pad is isolated from each adjoining pad and also from each land or mesa portion. Electronic components are mounted on the bottom ground plane surface with leads located within the holes of the grooves. Wires are then soldered to these leads and routed through the various grooves for interconnection of the electronic components.

The invention also includes a top member that is essentially an upper conductive ground plane. On the lower surface of this upper ground plane there are a plurality of deformable spring members for electrically contacting the top of each mesa portion when the upper ground plane is placed atop the base member. In this configuration the deformable members contact the top of each mesa portion and thus provide an upper ground plane that is connected (through the plated mesa holes) to the lower ground plane.

BRIEF DESCRIPTION OF THE DRAWINGS

The present invention can be more easily understood, and the further advantages and uses thereof more readily apparent, when considered in view of the description of the preferred embodiments and the following figures in which.

DESCRIPTION OF THE PREFERRED EMBODIMENTS

Figure 1:
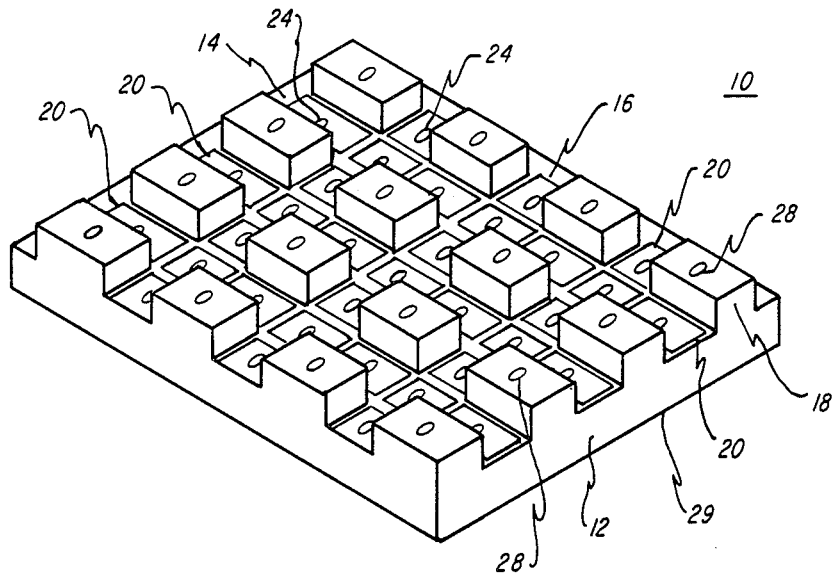
FIG. 1 is a perspective view of a portion of the multilayer circuit prototyping board constructed according to the teachings of the present invention.

FIG. 1 illustrates a multilayer circuit prototyping board 10 constructed according to the teachings of the present invention. The multilayer circuit prototyping board 10 includes a base 12 having grooves 14 and 16 cut therein. In one embodiment, the base 12 is constructed of a fiberglass composition commonly referred to as G10. Although the grooves 14 and 16 are shown in an orthogonal configuration, this configuration is not required. It is only necessary that the grooves be sufficiently numerous and in an appropriate orientation for laying signal wires within the grooves. The grooves 14 and 16 define mesas or lands 18 within the base 12. Solder or conductive pads 20 are provided in the grooves for connection of component leads. The components are mounted on the underside of the board 12 with their leads protruding through holes 24 in the solder pads 20. The component leads are connected by constructing signal paths within the grooves by connecting the solder pads 20 with wire or solder bridges. Plated-thru holes 28 are formed in each of the mesas 18 for connecting the ground plane 29 on the bottom side of the base 12 with a top ground plane to be discussed hereinafter. In one embodiment, the plated-thru holes 28 are spaced at five holes per inch, and the top surface of each mesa 18 is metalized.

Figure 2:
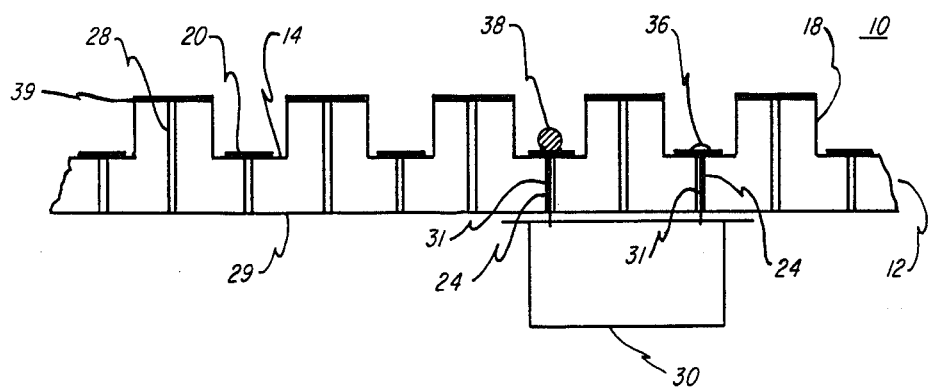
FIG. 2 is a side view of the base member shown in FIG. 1.

FIG. 2 is a partial side view of the multilayer circuit prototyping board 10, including several of the elements discussed in conjunction with FIG. 1. As can be seen, a component 30 is located on the bottom side of the base 12 with the component leads 31 extending through holes 24 to the solder pads 20. The solder pads 20 are then connected with wire or solder bridges to complete a circuit which includes the component 30. One lead 31 of the component 30 is electrically connected to a solder pad 20 with a solder bubble 36. The other lead 31 is connected, for example by soldering, to a wire 38. In the preferred embodent, the solder pads 20 are of the proper dimension to provide a 50 ohm stripline transmission line when connected. However, as those skilled in the art will realize, the solder pad dimensions can be modified to provide other impedance values. The metallization layer atop each mesa 18 is designated by reference character 39.

Figure 3:
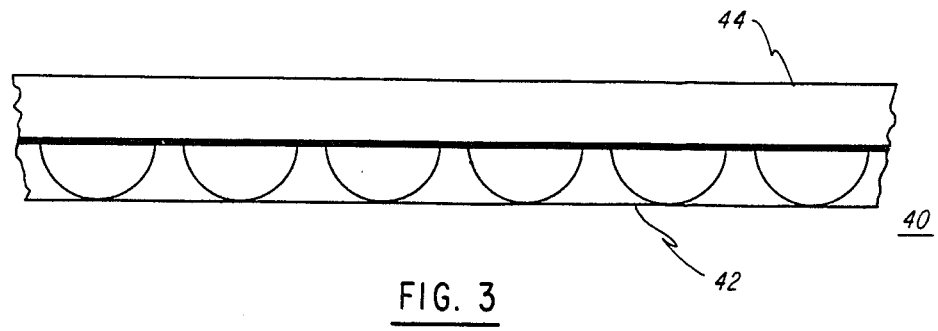
FIG. 3 is a side view of a top member of the multilayer circuit prototyping board.

After the breadboard circuit has been completed on the base 12, a removable ground plane 40, illustrated in FIG. 3, is placed atop the base 12. The removable ground plane 40 includes spring members 42 and a metal or conductive layer 44. The spring members 42 contact the mesas 18, and the holes 28 provide connection points between the conductive layer 44 (the top ground plane) of the removable ground plane 40, and the ground plane 29 on the bottom surface of the base 12. Thus the completed structure is a three-layer card having electrical characteristics nearly identical to a conventional three-layer stripline board.

Figure 4:
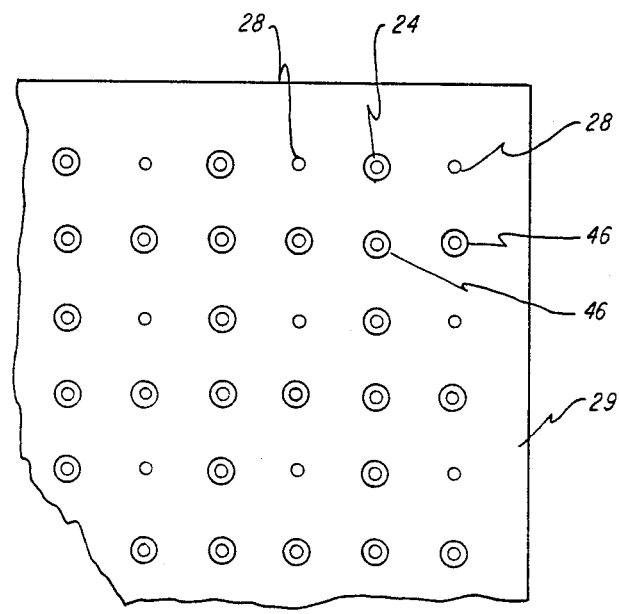
FIG. 4 is a plan view of the bottom surface of the multilayer circuit prototyping board illustrated in FIG. 1.

FIG. 4 is a partial bottom view of the base 12. The plated through holes 28 running from the bottom surface of the base member to the top of each mesa 18 are shown in FIG. 4. Also illustrated are the holes 24 that provide a path for the component leads, such as those associated with the component 30 shown in FIG. 2. Because the bottom surface of the base 12 is the ground plane 29, it is necessary to create a small iris around each of the holes 24 so that the bottom ground plane 29 does not short any of the component leads. These irises are clearly illustrated in FIG. 4 and designated by reference character 46.

Figure 5:
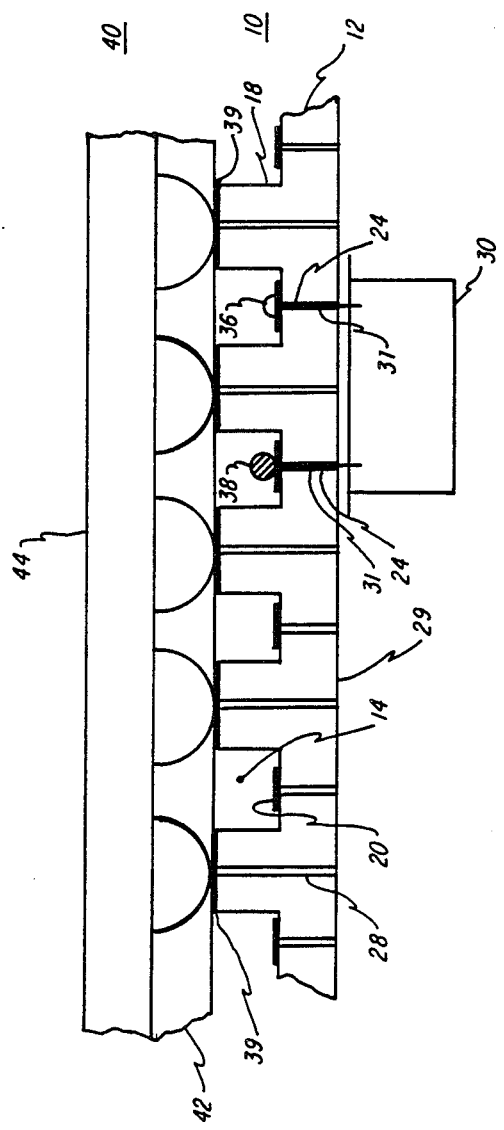
FIG. 5 is a side view of the combination of the base member shown in FIG. 2 and the top member shown in FIG. 3.

FIG. 5 illustrates the removable ground plane 40 placed atop the base 12.

Those skilled in the art will now realize the significant benefits associated with the multilayer circuit prototyping board of the present invention. It is easy to modify any circuit built on the prototyping board by simply removing the removable ground plane 40, desoldering the component interconnections, moving or replacing the components as desired, resoldering the components in place, and returning the removable ground plane 40 to its position above the base 12. This invention thus eliminates the time consuming and costly process of building and modifying three-layer printed circuit boards during the prototyping stage of a circuit.

The availability of a three-layer prototyping board offered by the present invention also overcomes the temptation to use a two-layer prototyping board when, in fact, a three-layer board would be more desirable. For example, it is possible that a high frequency amplifier circuit would oscillate if breadboarded on a two-layer microstrip board, but would function normally on a three-layer board.

The multilayer circuit prototyping board of the present invention also simplifies the transition from the breadboard version to a production version. The layout of the production version is essentially reduced to copying the breadboard pattern from the multilayer circuit prototyping board. Since the production version is then an electrical equivalent of the prototyping breadboard, the probability that errors will arise or changes will be required in the production version is greatly reduced.

Figure 6:
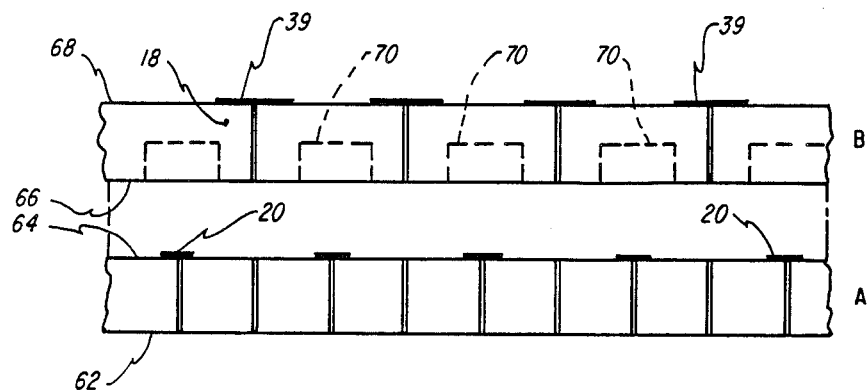

Manufacture of the multilayer circuit prototyping board 10 of the present invention involves the use of three 0.062" (in one embodiment) thick G10 copper clad boards sandwiched together and proceeds as follows. Referring to FIG. 6, board A is printed and etched on a bottom surface 62 and a top surface 64. The bottom surface 62 is the component side and the top surface 64 includes the conductive solder pads 20. Board B is free of copper on a bottom surface 66 ad is printed and etched from a third film on the top surface 68. Board B will eventually be milled out to form the mesas 18. All surfaces are provided with an alignment hole so that the boards A and B will align properly when sandwiched together. After Board A has been printed and etched, Board B is printed and etched then milled on the bottom surface 66 to produce shallow grooves 70. The grid is 0.080" wide and 0.035" deep (in one embodiment). The use of an alignment hole is also necessary at this time to provide the correct starting point for the milling process. After board B has been milled, the bottom surface 66 is juxtaposed with the top surface 64 of board A, and the boards are bonded using a urethane bonding agent or equivalent. At this point, the previously milled grooves 70 in board B are concealed. The alignment holes in boards A and B insure the proper marriage. After the bonding agent has cured, the married boards (A and B) are again placed on the mill with the top surface 68 up. Another grid configuration is cut to open up the grid pattern that was previously milled. The second milling process completes formation of the mesas 18. The holes 28 are then drilled and plated through, and finally the holes 24 are drilled.

Figure 7:
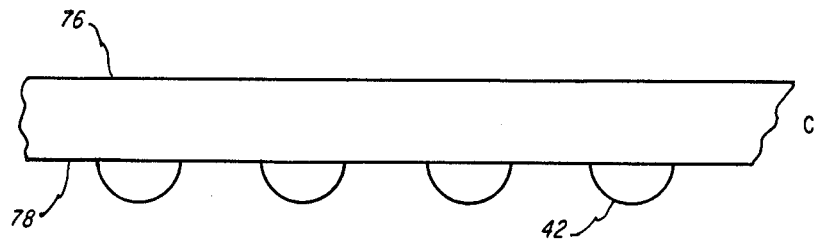
FIGS. 6 and 7 illustrate construction of the base member and top member, respectively.

Referring to FIG. 7, board C is conductive on both the top surface 76 and the bottom surface 78 and has spring members 42 soldered over the entire surface area on the bottom surface 78. The spring members 42 in one embodiment are printed, etched, and rolled using beryllium copper stock. After the married board (A plus B) is populated with electronic components and the circuit wiring has been completed, the removable ground plane 40 (which is essentially Board C) is sandwiched to the mesa side of the base 12 and retained with "U" clips soldered to the top and bottom sides of the final assembly.

While we have shown and described several embodiments in accordance with the present invention, it is understood that the same is not limited thereto but is susceptible to numerous changes and modifications as known to a person skilled in the art, and we therefore do not wish to be limited to the details shown and described herein, but intend to cover all such changes and modifications as are obvious to one of ordinary skill in the art.

What is claimed is:

1. A transmission line structure adapted for receiving electronic components having leads, and conductors to interconnect the electronic components, said transmission line structure comprising:

a base member having a conductive layer and an insulative layer, wherein a plurality of mesa portions are formed in said insulative layer, and wherein said mesa portions define grooves therebetween, and wherein said mesa portions have a conductive upper surface and are in electrical contact with said conductive layer;

wherein said base member includes a plurality of plated-through holes from said conductive layer to said grooves, and wherein each one of said plurality of holes terminates in a conductive pad on the mesa-side of said base member;

wherein said base member is adapted to receive electronic components on the conductive layer side with a lead of an electronic component extending through one of said plurality of plated-through holes;

wherein said grooves are adapted to accept conductors for interconnecting the electronic component leads;

a top member including a conductive plate and a plurality of conductive deformable members in electrical contact with said conductive plate, wherein said top member is placed atop said base member such that one of said deformable members contacts said conductive upper surface to establish electrical contact between said conductive plate and said conductive layer.

2. The transmission line structure of claim 1 wherein the electrical contact between the conductive upper surface of said mesa portions and the conductive layer comprises at least one plated through hole located within each mesa portion, each said at least one hole running from the conductive layer of said base member to the conductive upper surface of the respective mesa portion for connecting the conductive layer to the conductive plate of the top member.

* * * * *